(12) United States Patent
Thukaram et al.

(10) Patent No.: US 10,893,614 B2
(45) Date of Patent: Jan. 12, 2021

(54) METHOD FOR PRODUCING A COMPOSITE MATERIAL COMPONENT WITH AN INTEGRATED ELECTRICAL CONDUCTOR CIRCUIT

(71) Applicants: Airbus Operations GmbH, Hamburg (DE); Airbus India Operations Private Limited, Bangalore (IN)

(72) Inventors: Santosh Thukaram, Bangalore (IN); Shubham Shukla, Bangalore (IN); Peter Linde, Hamburg (DE)

(73) Assignees: AIRBUS OPERATIONS GMBH, Hamburg (DE); AIRBUS INDIA OPERATIONS PRIVATE LIMITED, Bangalore (IN)

( * ) Notice: Subject to any disclaimer, the term of this patent is extended or adjusted under 35 U.S.C. 154(b) by 0 days.

(21) Appl. No.: 16/548,362

(22) Filed: Aug. 22, 2019

(65) Prior Publication Data

US 2020/0068717 A1 Feb. 27, 2020

(30) Foreign Application Priority Data

Aug. 24, 2018 (DE) ........................ 10 2018 120 711

(51) Int. Cl.
*H05K 3/02* (2006.01)
*H05K 3/10* (2006.01)
*H05K 3/12* (2006.01)
*B32B 37/12* (2006.01)
*B32B 38/00* (2006.01)
(Continued)

(52) U.S. Cl.
CPC ............ *H05K 3/12* (2013.01); *B32B 37/0046* (2013.01); *B32B 37/1207* (2013.01); *B32B 38/145* (2013.01); *B64F 5/10* (2017.01); *H05K 1/03* (2013.01); *H05K 3/4644* (2013.01); *B32B 2262/106* (2013.01); *B32B 2457/08* (2013.01); *B64D 45/02* (2013.01); *B64D 2221/00* (2013.01)

(58) Field of Classification Search
CPC .......... H05K 3/12; H05K 1/03; H05K 3/4644; B32B 37/1207; B32B 38/145; B32B 37/0046; B64F 5/10; B29C 70/08; Y10T 29/49128; Y10T 29/49155; Y10T 29/49163
USPC .................................. 29/831, 832, 846, 851
See application file for complete search history.

(56) References Cited

U.S. PATENT DOCUMENTS 3,024,151 A    9/1957  Robinson
3,759,739 A * 9/1973  Varlas ..................... B29C 70/08
                                                                                     427/456

(Continued)

OTHER PUBLICATIONS

German Search Report; priority document.

*Primary Examiner* — Donghai D Nguyen
(74) *Attorney, Agent, or Firm* — Greer, Burns & Crain, Ltd.

(57) ABSTRACT

For the purpose of simple integration of conductor circuits into composite material components, a method and an apparatus for producing composite material components of this kind are proposed, wherein a conductor circuit is printed onto or applied in some other way to a support, is provided with a thermally activatable adhesive and then the support is applied to a blank of the composite material component for joint curing. The curing at high pressure and high temperature creates a strong connection between the conductor circuit and the composite material component.

6 Claims, 3 Drawing Sheets

(51) Int. Cl.
  *B32B 37/00* (2006.01)
  *H05K 1/03* (2006.01)
  *B64F 5/10* (2017.01)
  *H05K 3/46* (2006.01)
  *B64D 45/02* (2006.01)

(56) References Cited

U.S. PATENT DOCUMENTS

| | | | |
|---|---|---|---|
| 4,912,288 A * | 3/1990 | Atkinson | B29C 45/0053 |
| | | | 174/251 |
| 7,678,997 B2 | 3/2010 | Rawlings | |
| 8,257,538 B2 * | 9/2012 | Doi | H01L 21/6835 |
| | | | 156/241 |
| 2005/0181203 A1 | 8/2005 | Rawlings et al. | |
| 2008/0311374 A1 | 12/2008 | Mittal et al. | |
| 2009/0004480 A1 | 1/2009 | Dufresne et al. | |
| 2009/0029113 A1 | 1/2009 | Sanchez et al. | |
| 2016/0194792 A1 | 7/2016 | Satharasinghe et al. | |

* cited by examiner

METHOD FOR PRODUCING A COMPOSITE MATERIAL COMPONENT WITH AN INTEGRATED ELECTRICAL CONDUCTOR CIRCUIT

CROSS-REFERENCES TO RELATED APPLICATIONS

This application claims the benefit of the German patent application No. 10 2018 120 711.5 filed on Aug. 24, 2018, the entire disclosures of which are incorporated herein by way of reference.

FIELD OF THE INVENTION

The invention relates to a method and to an apparatus for producing a composite material component with an integrated electrical conductor circuit.

The invention further relates to a fiber composite material component which can be produced therewith. The invention finally relates to a vehicle or a wind power installation comprising a fiber composite material component of this kind.

BACKGROUND OF THE INVENTION

Composite materials, such as fiber-reinforced plastics in particular, are becoming increasingly important in the production of vehicles, in particular aircraft such as airplanes or helicopters, and in other technical fields, such as wind power installations.

Since most composite materials are non-conductive, different technologies have been developed in order to provide composite material components with electrically conductive regions or layers in order to realize, in particular, lightning protection.

Apparatuses and methods for integrating electrically conductive metal regions into fiber composite materials are known, in particular, from US 2009/0004480 A, US 2005/0181203 A1, US 2008/0311374 A1, US 2009/0029113 A1 and U.S. Pat. No. 7,678,997 B2.

SUMMARY OF THE INVENTION

The invention is based on an object of providing a method and an apparatus with which composite material components with integrated electrical conductor circuits can be produced in a simple and cost-effective manner.

According to a first aspect, the invention provides a method for producing a composite material component with an integrated electrical conductor circuit, comprising:
a) applying the electrical conductor circuit to a surface of a support,
b) applying a thermally activatable adhesive to the conductor circuit,
c) placing the surface of the support, which surface is provided with the conductor circuit, onto a component blank composed of composite material which is still to be cured, and
d) curing the component blank at a temperature above the activation temperature of the adhesive, so that the adhesive is activated and adhesively bonds the conductor circuit to the component.

It is preferred that step a) comprises the step:
printing the electrical conductor circuit onto the surface.
It is preferred that step a) comprises the step:
applying the electrical conductor circuit to a separating film as the support.
It is preferred that step a) comprises the step:
structuring the electrical circuit on the support.
It is preferred that step a) comprises the step:
selecting the support and the manner of application in such a way that the adhesion force between the support and the electrical conductor circuit is lower than the adhesion force of the adhesive in the activated state.
It is preferred that step a) comprises the step:
applying a prespecified layout of conductor tracks as the conductor circuit.
It is preferred that step a) comprises the step:
applying conductor tracks, which are formed from metal, to the surface of the support.
It is preferred that step b) comprises the step:
selectively applying the adhesive only to the surface of the conductor circuit, which surface is averted from the support.
It is preferred that step b) comprises the step:
applying the adhesive before step c).
It is preferred that step b) comprises the step:
applying the adhesive while carrying out step c).
It is preferred that step b) comprises the step:
applying the adhesive in free-flowing form.
It is preferred that step b) comprises the step:
applying the adhesive by means of a nozzle.
It is preferred that step b) comprises the step:
applying the adhesive by means of a brush.
It is preferred that step b) comprises the step:
applying the adhesive by means of an application tool which, in respect of its position, can be controlled in order to follow the profile of elements or conductor tracks of the conductor circuit.
It is preferred that step b) comprises the step:
applying the adhesive by means of spray-application.
It is preferred that step b) comprises the step:
coating the conductor circuit with the adhesive by means of selective coating methods.
It is preferred that step c) comprises the step:
providing a component blank composed of carbon fiber-reinforced composite material.
It is preferred that step c) comprises the step:
providing a component blank pre-formed from a prepreg.
It is preferred that step c) comprises the step:
providing a component blank with a fiber weave or a fiber scrim.
It is preferred that step c) comprises the step:
placing the support onto an outer or inner surface of the component blank, which surface is to be provided with the electrical conductor circuit.
It is preferred that step c) comprises the step:
rotating the support after the conductor circuit is applied to an upper surface and this surface is placed onto the top-most layer of the component blank.
It is preferred that step c) comprises the step:
placing the support, by way of the surface which is averted from the conductor circuit, onto a mold and inserting the component blank into the mold.
It is preferred that step c) comprises the step:
pressing a mold surface and/or a film surface onto that region of the component blank which is provided with the support.
It is preferred that step c) comprises the step:
providing a composite material panel blank, comprising fibers and curable matrix material, in such a way that a composite material panel can be obtained from the composite material panel blank by compression molding at elevated temperature.

It is preferred that step d) comprises the step:
curing the component, to which the support is applied, in an autoclave.

It is preferred that step d) comprises the step:
curing the component in a mold and/or in a vacuum pack.

It is preferred that step d) comprises the step:
curing the component at elevated pressure.

It is preferred that step d) comprises the step:
curing the component in a molding press.

The method preferably comprises the step
e) removing the support from the component,
which takes place after step d).

According to a further aspect, the invention provides an apparatus for producing a composite material component with an integrated electrical conductor circuit, comprising:

a conductor circuit application device for applying the electrical conductor circuit to a surface of a support, an adhesive application device for applying a thermally activatable adhesive to the conductor circuit, a transfer device for placing the surface of the support, which surface is provided with the conductor circuit, onto a component blank composed of composite material which is still to be cured, and a curing device for curing the component blank at a temperature above the activation temperature of the adhesive, so that the adhesive is activated and adhesively bonds the conductor circuit to the component.

It is preferred that the conductor circuit application device has a conductor circuit printing device for printing the electrical conductor circuit onto the surface.

It is preferred that the conductor circuit application device has a separating film provision device for providing a separating film as the support.

It is preferred that the conductor circuit application device has a conductor circuit application controller which is configured to control the conductor circuit application device for applying a prespecified layout of conductor tracks as the conductor circuit.

It is preferred that the conductor circuit application device has a metal material provision device for providing a metal material for applying conductor tracks which are formed from metal.

It is preferred that the adhesive application device has an adhesive application controller which is configured to actuate the adhesive application device for selectively applying the adhesive only to the surface of the conductor circuit, which surface is averted from the support.

It is preferred that the adhesive application device has an adhesive provision device for providing the adhesive in free-flowing form.

It is preferred that the adhesive application device has at least one nozzle for applying the adhesive.

It is preferred that the adhesive application device has at least one brush for applying the adhesive.

It is preferred that the adhesive application device has an application tool which, in respect of its position, can be controlled in order to follow the profile of elements or conductor tracks of the conductor circuit.

It is preferred that the adhesive application device has a spray device for applying the adhesive by means of spray-application.

It is preferred that the adhesive application device has a coating device for selectively coating the conductor circuit with the adhesive.

It is preferred that the curing device has a mold.
It is preferred that the curing device has an autoclave.
It is preferred that the curing device has a heating device.
It is preferred that the curing device has a furnace.
It is preferred that the curing device has a temperature control device for adjusting the temperature.
It is preferred that the curing device has a press.

According to a further aspect, the invention provides a fiber composite material component with an integrated electrical conductor circuit, which can be obtained using a method according to one of the preceding refinements.

According to a further aspect, the invention provides a fiber composite material component with an integrated electrical conductor circuit which has a prespecified pattern of conductor tracks which are adhesively bonded onto a subregion of the fiber composite material by means of a heat-activatable adhesive.

According to a further aspect, the invention provides a vehicle or a wind power installation, comprising a fiber composite material component with an integrated electrical circuit according to one of the preceding refinements.

The vehicle is preferably an aircraft, in particular an airplane.

An electrical conductor circuit is understood to mean at least one path in which electrons can flow from a voltage or current source, or an arrangement of paths of this kind. In particular, an electrical conductor circuit is understood to mean the arrangement of conductor tracks of at least one subregion of an electrical circuit. An example of an electrical conductor circuit is, for example, the arrangement of conductor tracks which can be found on a printed circuit board.

The invention relates to the production of composite material parts with electrical conductor circuits. The invention relates, in particular, to a production method which is required in order to generate the electrical conductor tracks, the electrical conductor circuit and/or paths for conducting electrons on the composite material parts. The method and the apparatus are preferably and particularly applicable to the composite material production of carbon fiber-reinforced plastics, glass fiber-reinforced plastics and hybrid composite materials which is carried out using an autoclave or a furnace.

The invention is applicable to all technologies and industries which produce high-power composite components, including the aerospace sector, motor vehicle and motorcycle manufacture, in the field of watercraft and the marine sector and in the field of wind power.

Up until now, there has been no large-scale implementation of integration of electrical conductor circuits in composite material structural components in a commercially available aircraft product or motor vehicle product.

The electrical conductor circuit can be realized using different means, such as, for example:
1. metal spraying,
2. inkjet printing,
3. electroless deposition, . . . .

Preferred refinements of the invention relate to an apparatus and to a method for printing an electrical conductor circuit and for applying the electrical conductor circuit to its ultimate target component by means of a separating film or pull-off film and by means of a temperature-sensitive adhesive.

By virtue of separating a printing process from the application process, the printing can take place with a high level of accuracy under controlled laboratory conditions.

The conductor circuit is preferably held in place by a separating film and is ultimately adhesively bonded to the component using heat and pressure. This preferably takes place only in the autoclave. Adhesion of maximum reliability can be achieved owing to the application of heat and pressure.

Some advantages of particularly preferred refinements of the invention will be explained in more detail below.

The conductor circuits can advantageously be manufactured with high-quality conductive material.

The conductor circuits can preferably be placed on the support, in particular a separating film, under controlled laboratory conditions.

Additional insulation materials, an insulation and protection layer or the like can preferably be applied if desired or required.

A controlled quantity of adhesive is preferably placed on the conductor circuit. Therefore, with preference, no secondary working processes are required. An adhesive connection can advantageously be achieved at high temperatures and high pressure, so that a very strong connection can be achieved.

BRIEF DESCRIPTION OF THE DRAWINGS

Exemplary embodiments of the invention will be explained in more detail below with reference to the appended drawings, in which.

DETAILED DESCRIPTION OF THE PREFERRED EMBODIMENTS

Figure 9:
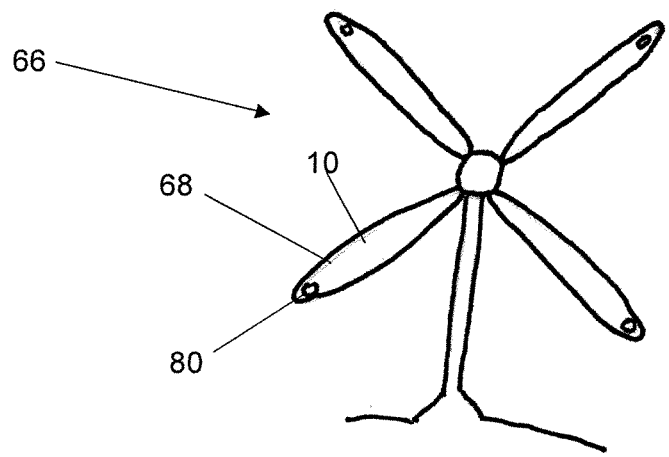
FIG. 9 shows a wind power installation which contains a composite material component which is provided with an electrical conductor circuit.

FIGS. 1 to 7 show different stages of a method for producing a composite material component 10 with an integrated electrical conductor circuit 12. The different devices 22, 26, 32, 34, 42, 46, 54, 56, 70 illustrated in FIGS. 1 to 7 for carrying out the method are part of an apparatus, designated 14 in its entirety, for producing the composite material component with an integrated electrical conductor circuit 12. FIG. 9 shows application examples of a composite material component 10 of this kind. The apparatus 14 can be, for example, a production installation for producing composite material components 10, as are already used, in principle, in airplane manufacture for example, but which has the modifications outlined below.

Figure 1:
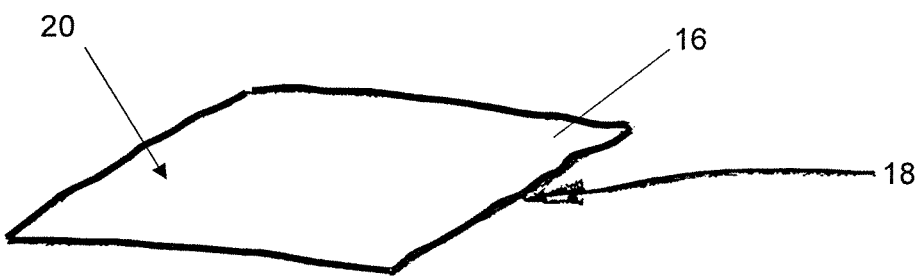
FIG. 1 shows a schematic illustration of a separating foil as a preferred embodiment of a support.

FIG. 1 provides a support 16 to which the conductor circuit 12 is initially applied. The support 16 used is, in particular, a separating film 18 or pull-off film. The separating film 18 used is, for example, a separating film as is currently used in a similar way in the production of composite components.

Figure 2:
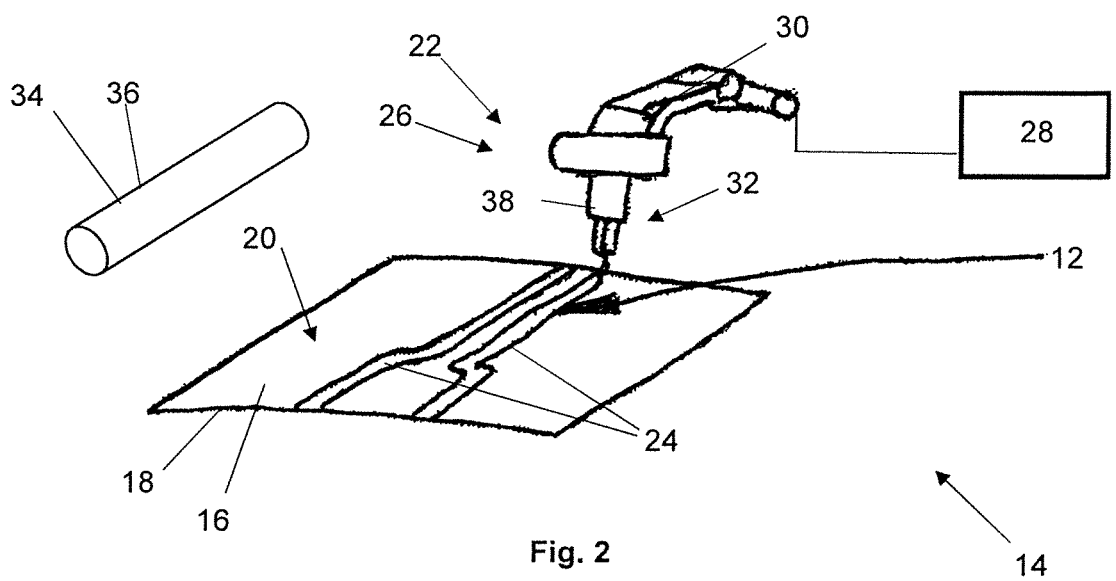
FIG. 2 shows a schematic perspective illustration of an embodiment of a conductor circuit application device for applying an electrical conductor circuit to the support.

As illustrated in FIG. 2, the electrical conductor circuit 12 is then applied to a first surface 20 of the support 16. The application takes place, in particular, by means of printing.

FIG. 2 illustrates an exemplary embodiment of a conductor circuit application device 22 by means of which a predetermined pattern of conductor tracks 24 is applied by selective application of conductive material, in particular metal.

To this end, the conductor circuit application device 22 has, in particular, a conductor circuit printing device 26 for printing the conductor circuit 12. The conductor circuit printing device 26 has a conductor circuit application controller 28 in which patterns to be manufactured are stored in a memory as corresponding files and which is configured to move a movement apparatus 30 (for example, robot arm) of the conductor circuit printing device 26 and to actuate a metal material provision device 32, which is configured as a printing nozzle, in particular, for providing the metal material for the conductor tracks 24.

FIG. 2 also further indicates a separating film provision device 34 by means of which the separating film 18 can be provided for printing purposes. By way of example, a separating film 18 can be unrolled from an appropriate supply roll 36.

As illustrated in FIG. 2, a printing head 38 is, in a manner controlled by means of the conductor circuit application controller 28 in accordance with the pattern stored therein for forming the conductor circuit 12, moved over the first surface 20 of the separating film 18 and actuated for correspondingly printing the conductor tracks 24.

Therefore, an electrical conductor circuit 12 can be produced in a highly accurate manner with high-quality conductive materials under controlled laboratory conditions.

Figure 3:
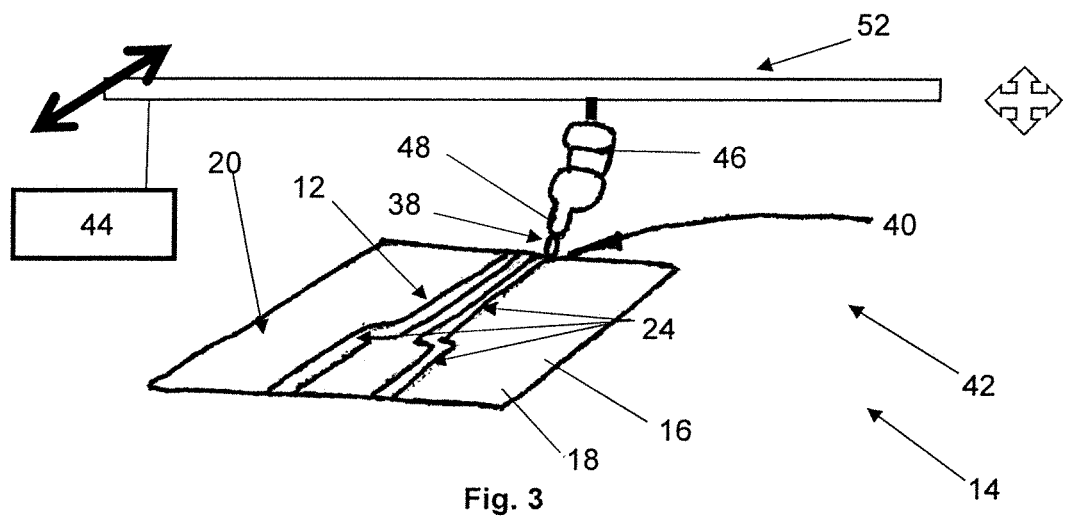
FIG. 3 shows a schematic perspective illustration of an exemplary embodiment of an adhesive application device for applying an adhesive to the electrical conductor circuit.

According to FIG. 3, a thermally activatable adhesive 40 is then applied to the conductor circuit 12.

To this end, an exemplary embodiment of an adhesive application device 42 is illustrated in FIG. 3.

The adhesive application device 42 has an adhesive application controller 44 for controlling the application process for the adhesive 40. By way of example, the adhesive application controller 44 is connected to or jointly configured with the conductor circuit application controller 28, so that the prespecified pattern of conductor tracks 24 can also be used for movement control of the adhesive application device 42.

The adhesive application device 42 has an adhesive provision device 46 for providing the adhesive 40 in free-flowing form.

The adhesive 40 provided is a thermally sensitive adhesive. In particular, an adhesive 40 is provided which is activated at temperatures above a predetermined activation temperature and cures at such temperatures. In particular, a thermoset adhesive is provided.

The adhesive application device 42 has an application tool 48, for example with a nozzle 50, a brush (not illustrated) or the like, which application tool, in terms of its position, can be controlled by a further movement apparatus 52 (for example, gantry system) in order to follow the profile of conductor tracks 24 of the conductor circuit 12.

The adhesive application device 42 can be arranged in the same location (for example production station of the apparatus 14) or at another station, such as the conductor circuit application device 22. In the latter case, the support 16, which is configured as the separating film 18 for example, is transported from the conductor circuit application device 22, illustrated in FIG. 2, to the adhesive application device 42, illustrated in FIG. 3, by means of suitable transfer devices 54.

The application of the adhesive 40 takes place on that side of the conductor tracks 24 and/or of the other elements of the conductor circuit 12 which is averted from the separating film 18.

In this way, a temperature-sensitive adhesive 40 is applied to the conductor circuit 12 by means of the adhesive application device 42. In a comparable manner, an insulation, which is formed from several layers, and protective materials can also be added at this station.

Figure 4:
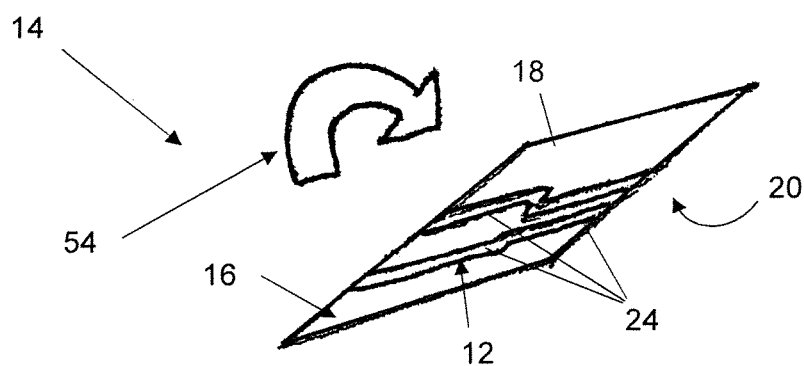
FIG. 4 shows the separating foil, which is provided with the conductor circuit and the adhesive, as an example of a support during the course of a transfer.

The transfer device 54 or a further transfer device 54 transports the support 16 from the adhesive application device 42 to a composite material component blank provision device 56, wherein a composite material component blank 58 is provided. The transfer step is illustrated in FIGS. 4 and 5, wherein FIG. 4 further illustrates that the first surface 20 which is provided with the conductor circuit 12 and initially faces upward is directed, by appropriately turning over or otherwise orienting the support 16, toward that component surface 60 of the composite material component blank 58 which is to be provided with the conductor circuit 12.

Figure 8:
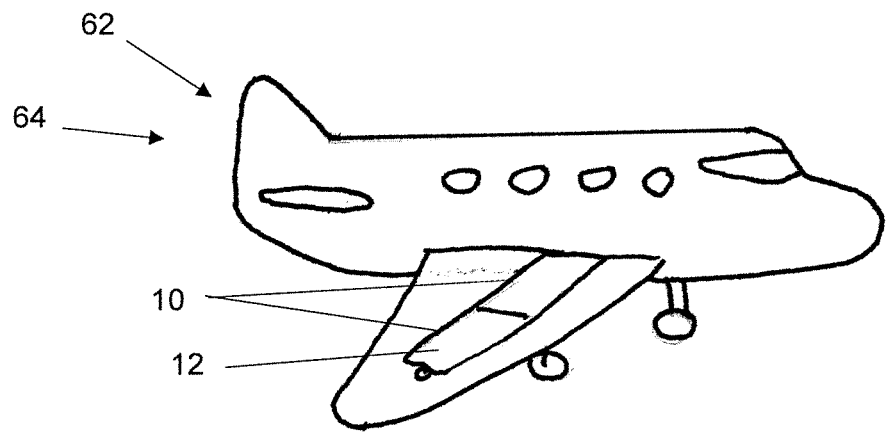
FIG. 8 shows an airplane as an exemplary embodiment of a vehicle, in particular aircraft, which contains a composite material component which is provided with a conductor circuit.

The composite material component blank provision device 56 can be any production device which provides a blank for fiber-reinforced composite materials comprising fibers embedded in matrix material. By way of example, components for aircraft 62, in particular airplanes 64, or components of wind power installations 66, as are illustrated in FIGS. 8 and 9, are pre-formed by means of provision devices 56 of this kind.

The support 16, which is configured as a separating film 18 for example, is turned over and applied directly in contact with the last layer of the composite material component blank 58 during the otherwise usual production of composite material components 10 of this kind by means of an appropriate function of the transfer device 54 in particular. The subsequent composite material component 10, which is to be produced from the composite material component blank 58 by curing, can be, in particular, a panel for the airplane 64 or for vanes 68 of the wind power installation 66, which panel is formed from fiber-reinforced plastics, such as carbon fiber-reinforced plastic or glass fiber-reinforced plastic for example.

Figure 5:
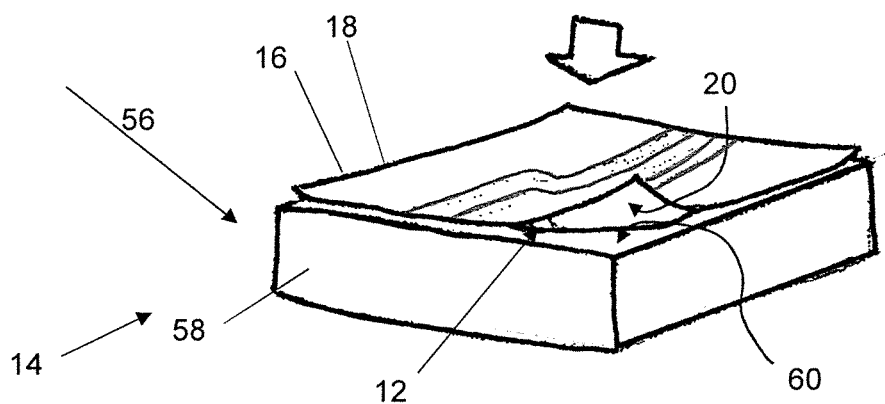
FIG. 5 shows a composite material component blank to which the support is applied.

In FIG. 5, direct contact is preferably made on a component surface 60 which is directed outwards or inwards during subsequent operation. The support 16 is preferably applied to a component surface 60 which is later surrounded by a vacuum pack ("bag side").

The separating film 18 can also be placed on a tool side, which faces a molding tool ("tool side"), or on inner surfaces, such as flanges or the like.

When contact is made, the first surface 20 and, in particular, the conductor circuit 12 which is applied to it, are brought into contact with this component surface 60, wherein an adhesive 40 is inserted therebetween.

Figure 6:
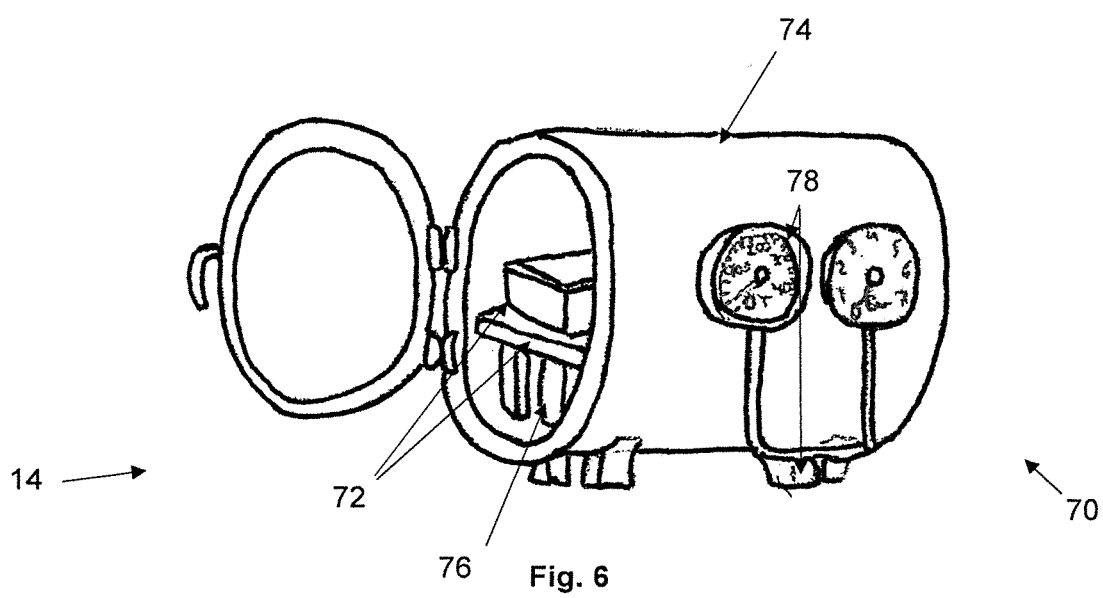
FIG. 6 shows an exemplary embodiment of a curing device in order to produce a composite material component from the composite material component blank by curing.
Figure 7:
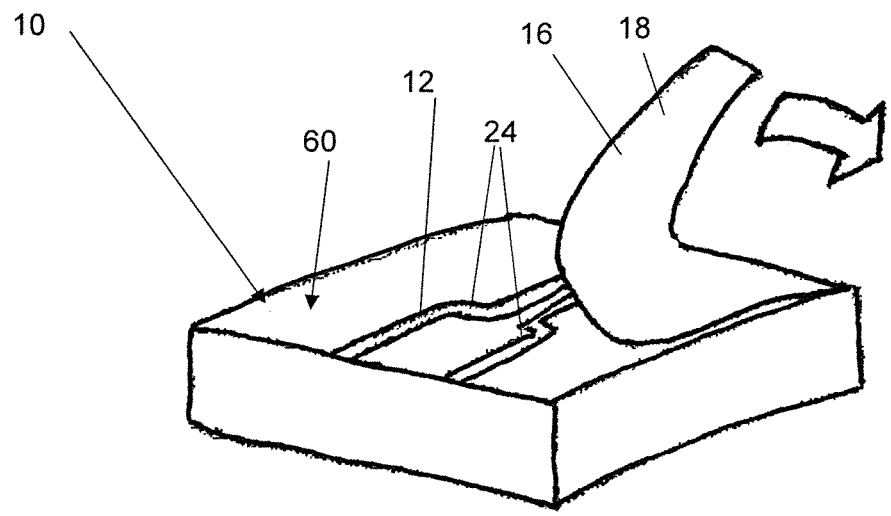
FIG. 7 shows a schematic illustration of a further method step which is carried out after the curing.

FIG. 6 shows a step of curing the composite material component blank 58, as a result of which the composite material component 10 is produced. A curing device 70, which has, in a known manner, a mold 72 (for example the molding tool), an autoclave 74 or furnace and possibly a press 76 or vacuum packing device (not illustrated), is used for this purpose.

The curing device 70 is further provided with a temperature control device 78 which controls the temperature on the composite material component 10 by means of a heating device during curing. A temperature which lies above the activation temperature of the adhesive 40 is reached in the process.

Furthermore, the support 16 is pressed together with the composite material component blank 58 by the press 76 and/or an appropriate pressure in the autoclave 74—which can likewise be controlled—, so that, at the same time as the composite material component blank 58 is cured, the adhesive 40 is cured at high temperature and high pressure.

In one procedure, the composite material component blank 58 is packed in a film together with the separating film 18 applied to it and subjected to the action of a vacuum, so that a very tight package is produced and the mold is consolidated. This composite is then moved to the autoclave 74 for curing purposes. In the autoclave 74, the high temperature—for example 120° C. to 180° C.—activates the adhesive 40, this ensuring a good adhesive connection between the conductor circuit 12 and the composite material component 10.

As illustrated in FIG. 6, the composite material component 10 is removed from the autoclave 74 when the curing step has been completed.

The support 16, which is configured as a separating film 18 for example, is removed from the composite material component 10, wherein the conductor circuit 12 remains strongly adhesively bonded to the component surface 60.

The printed conductor circuit 12 remains strongly connected to the composite material component 10 in this way after the separating film 18 is removed.

Accordingly, composite material components 10 which are provided with a conductor circuit 12 can be used for different purposes.

FIG. 8 shows, as an application example, the airplane 64 as an example of a vehicle, in particular, an aircraft. Here, for example, panels, which form subregions of the wing for example, can be formed by an appropriate composite material component 10, so that electrical devices on the wing can be actuated by means of the conductor circuit 12.

FIG. 9 shows a wind power installation 66 as a further example of a possible use of the composite material component 10 which is provided with the conductor circuit 12. By way of example, the vanes 68 of the wind power installation 66 are constructed from composite material components 10 which are configured as panels. The conductor circuit 12 integrated therein can be used for actuating position lamps 80 on the vane tips. Sensors which can transmit wire-bound signals via the conductor circuit 12 and can accordingly be actuated via the conductor circuit can also be fitted to the vanes 68.

It goes without saying that actuators or the like can also be supplied with power and/or control signals via the conductor circuit 12 in all application examples.

While at least one exemplary embodiment of the present invention(s) is disclosed herein, it should be understood that modifications, substitutions and alternatives may be apparent to one of ordinary skill in the art and can be made without departing from the scope of this disclosure. This disclosure is intended to cover any adaptations or variations of the exemplary embodiment(s). In addition, in this disclosure, the terms "comprise" or "comprising" do not exclude other elements or steps, the terms "a" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

LIST OF REFERENCE SYMBOLS

10 Composite material component
12 Conductor circuit
14 Apparatus
16 Support
18 Separating film
20 First surface
22 Conductor circuit application device
24 Conductor track
26 Conductor circuit printing device
28 Conductor circuit application controller
30 Movement apparatus
32 Metal material provision device
34 Separating film provision device
36 Supply roll
38 Printing head
40 Adhesive
42 Adhesive application device
44 Adhesive application controller
46 Adhesive provision device
48 Application tool
50 Nozzle
52 Further movement apparatus
54 Transfer device
56 Composite material component blank provision device
58 Composite material component blank
60 Component surface
62 Aircraft
64 Airplane
66 Wind power installation
68 Vane
70 Curing device
72 Mold
74 Autoclave
76 Press
78 Temperature control device
80 Position lamp

The invention claimed is:
1. A method for producing a composite material component with an integrated electrical conductor circuit, comprising:
 a) applying the electrical conductor circuit to a surface of a support,
 b) applying a thermally activatable adhesive to the conductor circuit with a print head, wherein a position of the print head can be controlled in order to follow a profile of elements or conductor tracks of the conductor circuit,
 c) placing the surface of the support, which surface is provided with the conductor circuit, onto a component blank composed of composite material which is still to be cured, and
 d) curing the component blank in an autoclave at a temperature above the activation temperature of the adhesive, so that the adhesive is activated and adhesively bonds the conductor circuit to the component.

2. The method according to claim 1, wherein step a) comprises at least one or more of the steps:
 a1) printing the electrical conductor circuit onto the surface,
 a2) applying the electrical conductor circuit to a separating film as the support,
 a3) structuring the electrical circuit on the support,
 a4) selecting the support and a manner of application in such a way that an adhesion force between the support and the electrical conductor circuit is lower than the adhesion force of the adhesive in an activated state,
 a5) applying a prespecified layout of conductor tracks as the conductor circuit, or
 a6) applying conductor tracks, which are formed from metal, to the surface of the support.

3. The method according to claim 1, wherein step b) comprises at least one or more of the following steps:
 b1) selectively applying the adhesive only to the surface of the conductor circuit, which surface is averted from the support,
 b2) applying the adhesive before step c),
 b3) applying the adhesive while carrying out step c), or
 b4) applying the adhesive in free-flowing form.

4. The method according to claim 1, wherein step c) comprises at least one or more of the steps:
 c1) providing a component blank composed of carbon fiber-reinforced composite material,
 c2) providing a component blank pre-formed from a prepreg,
 c3) providing a component blank with a fiber weave or a fiber scrim,
 c4) placing the support onto an outer or inner surface of the component blank, which surface is to be provided with the electrical conductor circuit,
 c5) rotating the support after the conductor circuit is applied to an upper surface and this surface is placed onto a top-most layer of the component blank,
 c6) placing the support, by way of the surface which is averted from the conductor circuit, onto a mold and inserting the component blank into the mold,
 c7) pressing a mold surface onto that region of the component blank which is provided with the support, or
 c8) providing a composite material panel blank, comprising fibers and curable matrix material, in such a way that a composite material panel can be obtained from the composite material panel blank by compression molding at elevated temperature.

5. The method according to claim 1, wherein step d) comprises at least one or more of the steps:
 d1) curing the component in a mold, or
 d2) curing the component in a molding press.

6. The method according to claim 1, further comprising the step
 e) removing the support from the component, which takes place after step d).

* * * * *